(12) United States Patent
Joe et al.

(10) Patent No.: US 8,148,762 B2
(45) Date of Patent: Apr. 3, 2012

(54) PHOTODIODES, IMAGE SENSING DEVICES AND IMAGE SENSORS

(75) Inventors: In-Sung Joe, Seoul (KR); Yoon-dong Park, Yongin-si (KR); Young-gu Jin, Hwaseong-si (KR); Seung-hyuk Chang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 422 days.

(21) Appl. No.: 12/216,556

(22) Filed: Jul. 8, 2008

(65) Prior Publication Data

US 2009/0146198 A1 Jun. 11, 2009

(30) Foreign Application Priority Data

Dec. 11, 2007 (KR) .................. 10-2007-0128272

(51) Int. Cl.
*H01L 31/062* (2012.01)

(52) U.S. Cl. . 257/294; 257/292; 257/436; 257/E31.054; 257/E31.121

(58) Field of Classification Search .......... 257/290–292, 257/294, 435, 436, 461, 463, E31.053, E31.054, 257/E31.121, E31.127
See application file for complete search history.

(56) References Cited

U.S. PATENT DOCUMENTS

| 7,153,720 B2* | 12/2006 | Augusto ................. 438/69 |
| 2005/0121599 A1* | 6/2005 | Mouli ................. 250/208.1 |
| 2007/0257283 A1* | 11/2007 | Chyan et al. ................. 257/290 |
| 2009/0323060 A1* | 12/2009 | Knipp ................. 356/327 |

* cited by examiner

*Primary Examiner* — Matthew E Warren
(74) *Attorney, Agent, or Firm* — Harness, Dickey & Pierce, P.L.C.

(57) ABSTRACT

Provided are photodiodes, image sensing devices and image sensors. An image sensing device includes a p-n junction photodiode having a metal pattern layer on an upper surface thereof. An image sensor includes the image sensing device and a micro-lens formed above the metal pattern layer. The metal pattern layer filters light having a first wavelength.

23 Claims, 5 Drawing Sheets

PHOTODIODES, IMAGE SENSING DEVICES AND IMAGE SENSORS

PRIORITY STATEMENT

This application claims priority under 35 U.S.C. §119 to Korean Patent Application No. 10-2007-0128272, filed on Dec. 11, 2007, in the Korean Intellectual Property Office, the entire contents of which are incorporated herein by reference.

BACKGROUND

Description of the Related Art

A conventional or related art image sensor is a photoelectric conversion device that converts an optical image into an electrical signal by detecting light. Conventional image sensors may be used for storing and transmitting an optical image, and for reproducing the optical image in a display apparatus.

Conventional silicon semiconductor image sensors may be classified as charge coupled device (CCD) image sensors or complementary metal oxide semiconductor (CMOS) image sensors. Conventional CMOS image sensors may have lower production costs using conventional semiconductor manufacturing processes. These manufacturing processes may be simpler, consume less power, and/or peripheral circuits may be more readily integrated into a single chip as compared to the CCD image sensor. Thus, CMOS image sensors may be more suitable for relatively small mobile terminals such as mobile phones, personal mobile terminals, personal digital assistants (PDAs), smart phones, cameras, etc.

A conventional CMOS image sensor may include a plurality of unit pixels arranged in an array on a semiconductor substrate. Each of the unit pixels may include a p-n junction photodiode and transistors. The photodiode and the transistors may be integrated on a single chip. The p-n junction photodiode may generate charges by detecting external light. The transistors may output electrical signals in response to the optical charge generated from the p-n junction photodiode.

In this way, a conventional CMOS image sensor processes an image using a p-n junction photodiode that generates charges based on optical signals. A control device may control and/or process the optical signals.

FIG. 1 is a cross-sectional view of a conventional CMOS image sensor. FIG. 2 is a scanning electron microscope (SEM) image for explaining signal distortion in a conventional CMOS image sensor.

Referring to FIG. 1, a conventional CMOS image sensor 1 may include a photodiode 2, a metal wiring 4 for peripheral circuits, a polymer color filter 6, and a micro-lens 8. Spaces between the above elements may be filled with insulating layers (not shown). The photodiode 2 may include an n-type doping region 2b formed by doping an n-type dopant in a p-type silicon substrate 2a.

The color filter 6 may be arranged below the micro-lens 8. If a vertical distance from the micro-lens 8 to the photodiode 2 is greater than about 5 μm to about 10 μm, the size of the photodiode 2 must reduced in order to compensate. This reduction in size of the photodiode 2 may reduce a sensitivity of the conventional CMOS image sensor 1.

Additionally, because a relatively large amount of light is absorbed while passing through the color filter 6 and the insulating layers, a relatively small amount of light actually reaches the photodiode 2, which may further reduce the sensitivity of the CMOS image sensor.

Referring to FIG. 2, in the conventional CMOS image sensor 1, light that has passed through the micro-lens 8 may enter the photodiode 2 of an adjacent pixel due to reflecting by the metal wiring 4. The light entering the adjacent pixel may result in optical cross-talk, which causes signal distortion.

SUMMARY

Example embodiments relate to photodiodes, image sensing devices and image sensors having increased sensitivity. According to at least some example embodiments, an image sensor may include a p-n junction photodiode and a metal pattern layer that utilizes surface plasmon resonance.

Example embodiments also may provide a CMOS image sensor having a photodiode. The photodiode may have a metal pattern formed on its surface. The metal pattern may filter light having a particular or given wavelength without an additional color filter. This may increase the amount of light sensed by the image sensor.

At least one example embodiment provides an image sensing device including a p-n junction photodiode. A metal pattern may be arranged on an upper surface of the p-n photodiode.

According to at least some example embodiments, the metal pattern layer may be formed in a strip pattern, an island shape pattern, a metal particle layer, or the like. The metal pattern layer may be a metal thin film layer having a contact hole pattern.

The CMOS image sensor may further include a dielectric film formed on an upper surface of the p-n junction photodiode, wherein the metal pattern layer is formed on the dielectric film. The dielectric film may be formed of at least one material selected from the group consisting of $SiO_2$, SiON, $HfO_2$, and $Si_3N_4$, or the like. The dielectric film may have a thickness of about 3 nm to about 100 nm, inclusive. The metal pattern layer may be formed of at least one metal selected from the group consisting of Au, Ag, Cu, Al, and W, or the like.

At least one other example embodiment provides a CMOS image sensor. The image sensor may include a p-n junction photodiode having a metal pattern layer arranged on an upper surface thereof. A micro-lens may be arranged above the metal pattern layer.

According to at least some example embodiments, the metal pattern layer may include a plurality of regions. Each region may define one of a plurality of sub-pixel regions. The sub-pixel regions may include at least a red sub-pixel region, one or more green sub-pixel regions, and a blue sub-pixel region. The metal pattern layer may be comprised of nano-dots. The nano-dots defining the red, green, and blue sub-pixel regions may have first, second, and third sizes, respectively. The second size may be smaller than the first size and the third size may be smaller than the second size.

According to at least some example embodiments, the nano-dots defining the red sub-pixel region may be spaced a first distance apart, the nano-dots defining the green sub-pixel region may be spaced a second distance apart, and the nano-dots defining the blue sub-pixel region may be spaced a third distance apart. The second distance may be shorter than the first distance, and the third distance may be shorter than the second distance. The nano-dots may have a shape selected from the group consisting of or including a triangular shape, a rectangular shape, a pentagonal shape, a circular shape, and a star shape.

BRIEF DESCRIPTION OF THE DRAWINGS

Example embodiments will become more apparent by describing in detail the attached drawings in which.

DETAILED DESCRIPTION OF EXAMPLE EMBODIMENTS

Figure 1:
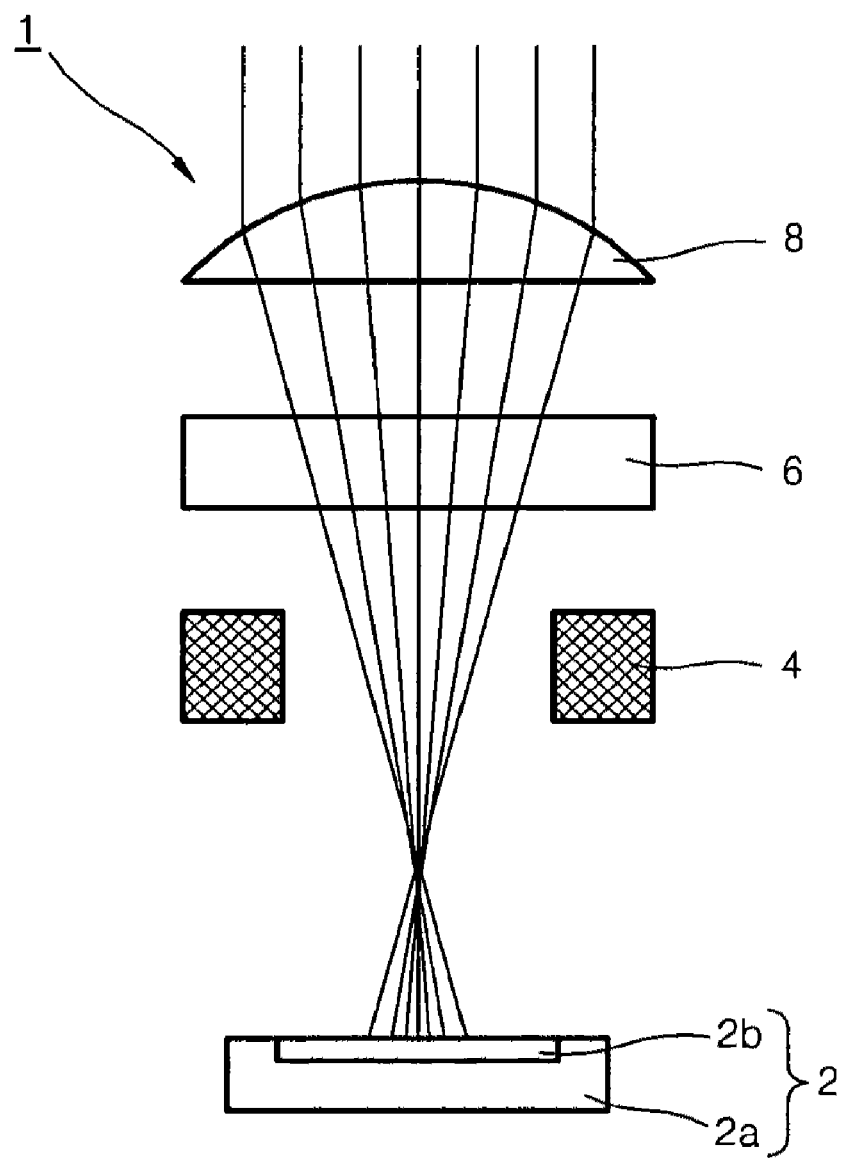
FIG. 1 is an example cross-sectional view of a conventional CMOS image sensor.
Figure 2:
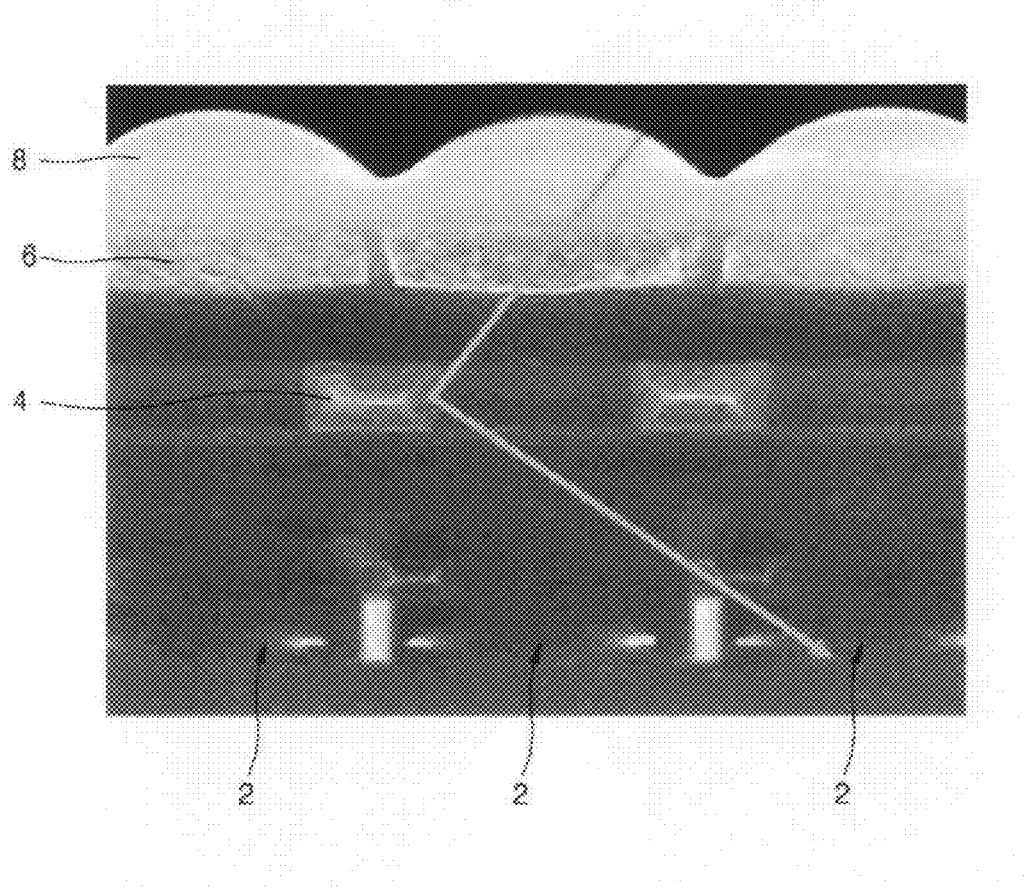
FIG. 2 is an example scanning electron microscope (SEM) image of the conventional CMOS image sensor of FIG. 1.

Various example embodiments will now be described more fully with reference to the accompanying drawings. However, specific structural and functional details disclosed herein are merely representative for purposes of describing example embodiments, and one skilled in the art will appreciate that example embodiments may be embodied in many alternate forms and should not be construed as limited to only the example embodiments set forth herein.

It should be understood that, although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a similar fashion (e.g., "between" versus "directly between", "adjacent" versus "directly adjacent", etc.).

The terminology used herein is for the purpose of describing example embodiments only and is not intended to be limiting of the example embodiments. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments described below with respect to the drawings are provided so that this disclosure will be thorough, complete and fully convey the concept of example embodiments to those skilled in the art. In the drawings, like numbers refer to like elements throughout. Further, the thicknesses of layers and regions are exaggerated for clarity in the drawings.

A p-n junction photodiode and a CMOS image sensor having the p-n junction photodiode according to example embodiments will now be described more fully with reference to the accompanying drawings in which example embodiments are shown.

Figure 3:
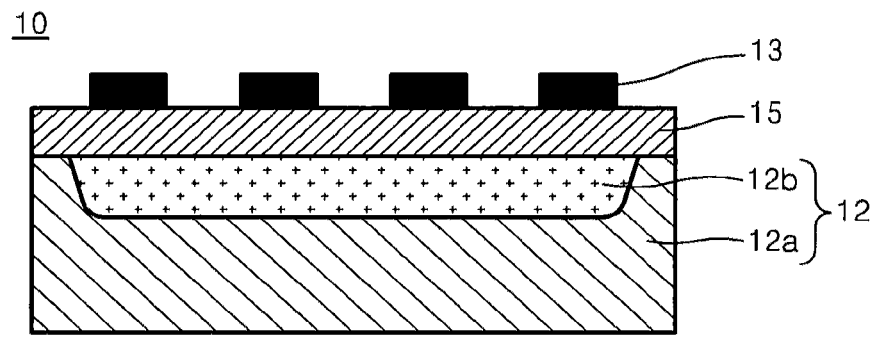
FIG. 3 is an example cross-sectional view of an image sensing device according to example embodiments.

FIG. 3 is a cross-sectional view of an image sensing device according to example embodiments.

Referring to FIG. 3, the image sensing device 10 may include a dielectric film 15 and a metal pattern 13 formed sequentially on a p-n junction photodiode 12. The p-n junction photodiode 12 may include a first doping region 12b. The first doping region 12b may be formed by doping a first dopant into the silicon substrate 12a. In one example, the first dopant may be an n-type dopant, and the silicon substrate may be a p-type substrate.

The dielectric film 15 may be relatively thin such that light incident on the metal pattern 13 may be transmitted to the p-n junction photodiode 12. For example, and the dielectric film 15 may have a thickness of between about 3 nm and about 100 nm, inclusive.

The dielectric film 15 may function as a seed layer for the metal pattern 13. The dielectric film 15 may be formed of, for example, a material selected from $SiO_2$, SiON, $HfO_2$, $Si_3N_4$, a combination thereof, or the like. The dielectric film 15 may be transparent, partially transparent or translucent.

When light impinges on a portion of the surface of the metal pattern 13, surface plasmon, or surface electromagnetic waves, may be formed due to the interaction of light with electrons on the surface of the metal pattern 13. The surface plasmon may increase the time that the light resonates within the metal pattern 13.

Due to the surface plasmon phenomenon of the metal pattern 13, the p-n junction photodiode 12 may have more time to detect the light incident to the p-n junction photodiode 12, thereby increasing sensitivity of the image sensing device 10.

Still referring to FIG. 3, the metal pattern 13 may be, for example, a strip pattern, an island shape pattern, a metal particle layer, or the like. Also, the metal pattern 13 may be a contact hole pattern in which contact holes are formed in a thin metal film. The metal pattern 13 may be formed of a material selected from Au, Ag, Cu, Al, W, or the like.

According to example embodiments, the metal pattern 13 may be formed to have different shapes and sizes of the patterns using different materials depending on the light to be detected by the p-n junction photodiode 12. For example, the material, shape, and size of the metal pattern layer 13 may affect which wavelengths of light are transmitted through the metal pattern layer 13 to the p-n junction photodiode 12. Thus, the metal pattern 13 may function as a color filter.

Figure 4:
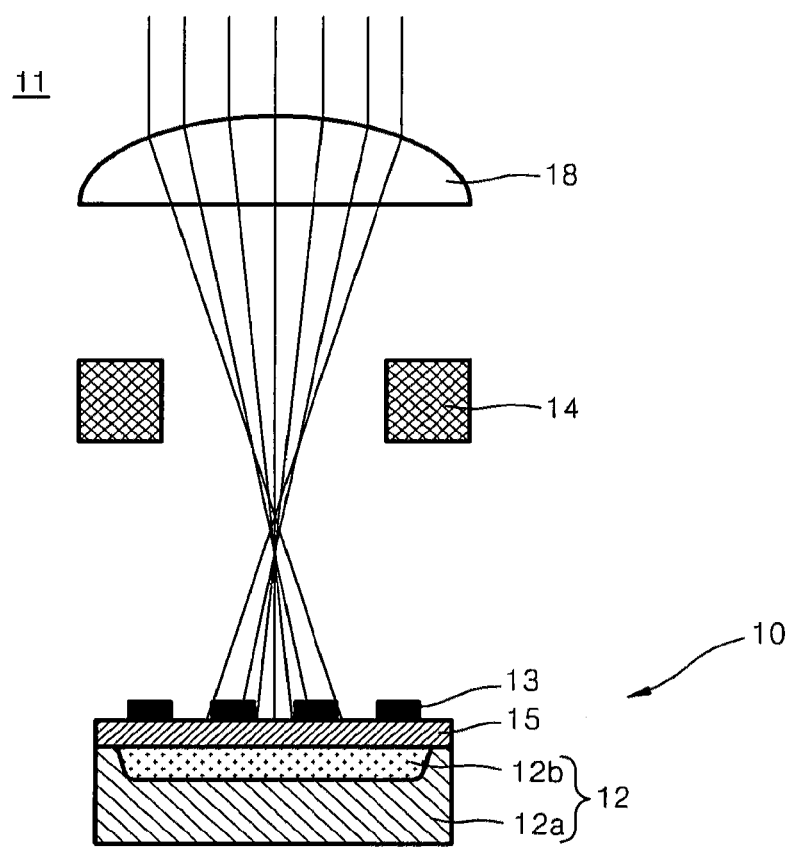
FIG. 4 is an example cross-sectional view of a CMOS image sensor including a p-n junction photodiode according to example embodiments.

FIG. 4 is an example cross-sectional view of a CMOS image sensor according to example embodiments. As shown, the CMOS image sensor 11 may include the image sensing device 10 of FIG. 3. Like reference numerals are used to indicate elements substantially identical to the elements of FIG. 3, and thus, the detailed description thereof will not be repeated.

Referring to FIG. 4, the CMOS image sensor 11 may include the image sensing device 10, a peripheral circuit metal wiring 14, and a micro-lens 18. Spaces between the components of the image sensor 11 may be filled with insulating layers (not shown). The peripheral circuit metal wiring 14 and the micro-lens 18 may be arranged above the image sensing device 10 such that incident light passes through the micro-lens 18 and past the peripheral circuit metal wiring 14 before reaching the image sensing device 10.

According to example embodiments, but unlike the conventional art, a separate color filter may be omitted from the CMOS image sensor 11. As a result, a distance between the micro-lens 18 and the p-n junction photodiode 12 may be shorter when compared to the conventional art. Thus, a more compact CMOS image sensor 11 may be formed. Moreover, light incident on the p-n junction photodiode 12 may be more readily controlled when compared to the conventional CMOS image sensor 1, and thus, light reflected by the peripheral circuit metal wiring 14 may be suppressed and/or prevented. This may reduce and/or eliminate the occurrence of cross-talk, and incident light may be focused more precisely onto the p-n junction photodiode 12.

The image sensing device 10 in FIG. 4 may have the same or substantially the same configuration as that of FIG. 3. For example, the image sensing device 10 may include a p-n junction photodiode 12 comprising a p-type dopant region 12a and an n-type dopant region 12b, and a dielectric film 15. A metal pattern 13 may be formed on the p-n junction photodiode 12.

Figure 5:
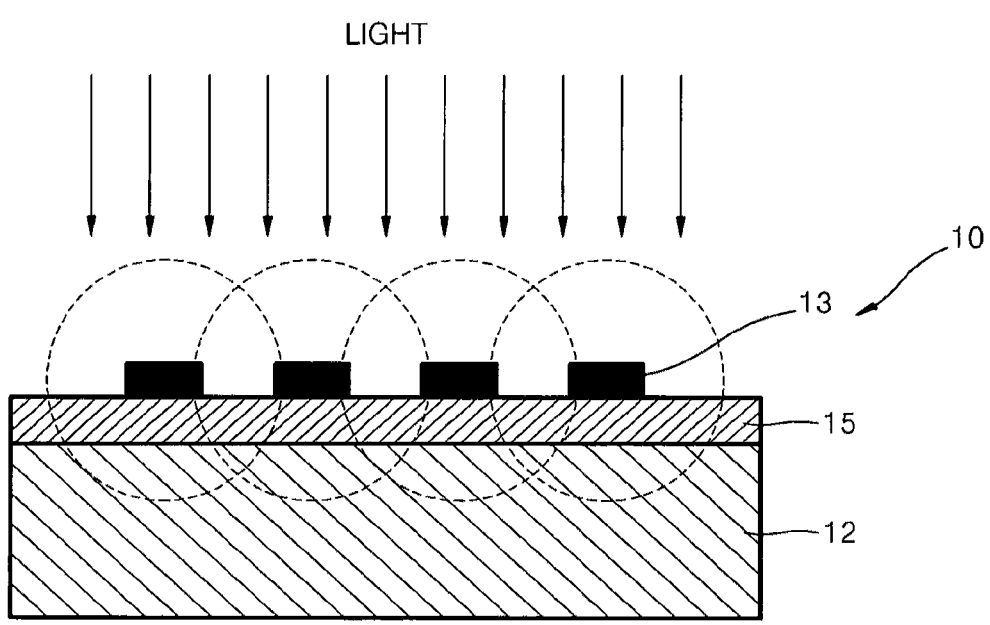
FIG. 5 is an example cross-sectional view illustrating a sensing process of a CMOS image sensor using plasmon phenomenon according to example embodiments.

FIG. 5 is an example cross-sectional view showing a sensing process of a CMOS image sensor using plasmon phenomenon according to example embodiments.

Referring to FIGS. 4 and 5, light that has passed through the micro-lens 18 and the peripheral circuit metal wiring 14 reaches the p-n junction photodiode 12. The incident light may cause a surface plasmon resonance phenomenon due to the metal pattern 13, thereby increasing the sensitivity of the CMOS image sensor 11. In FIG. 5, dotted circles represent regions where the surface plasmon resonance phenomenon occurs due to the metal pattern 13.

Figure 6:
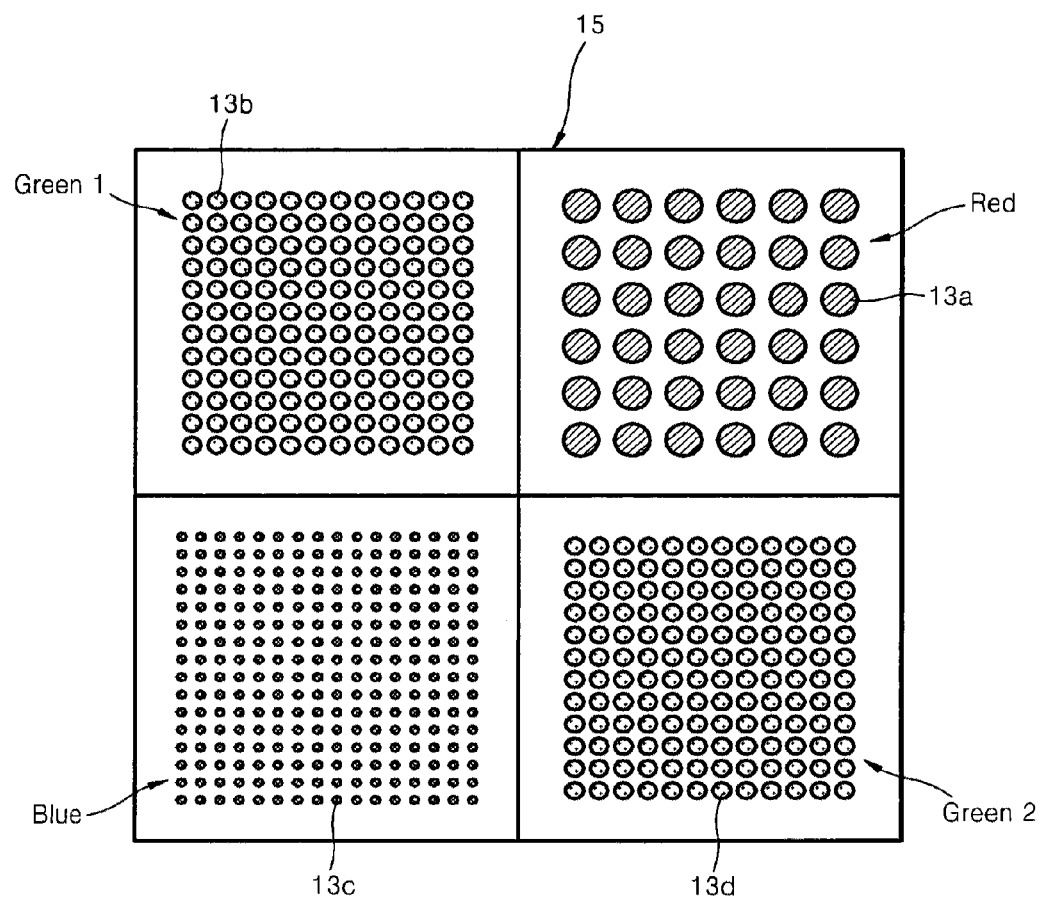
FIG. 6 is an example plan view of a metal pattern formed pixel region of the photodiode according to example embodiments.

FIG. 6 is an example plan view of metal patterns formed in four regions of the photodiode according to example embodiments.

Referring to FIGS. 4 and 6, the dielectric film 15 corresponding to a pixel of the CMOS image sensor 11 may be divided into a plurality of (e.g. four) regions. A metal pattern 13a, 13b, 13c, and 13d may be formed in each of the four regions. The nano-dots 13a formed in a red sub-pixel region Red may have a first size and may be comprised of gold. The metal pattern 13a may transmit red wavelength light. Nano-dots 13b and 13d formed in green sub-pixel regions Green 1 and Green 2 may have a second size and may be comprised of silver. The nano-dots 13b and 13d may transmit green wavelength light. Nano-dots 13c formed in a blue sub-pixel region Blue may have a third size and may be comprised of gold. The nano-dots 13c may transmit blue wavelength light.

The gold nano-dots 13a may be larger than the silver nano-dots 13b and 13d and/or may have narrower gaps between the nano-dots 13a than the silver nano-dots 13b and 13d. The nano-dots 13c may be smaller than the silver nano-dots 13b and 13d and/or gaps between the nano-dots 13c may be larger than that of silver nano-dots 13b and 13d. The nano-dots 13c may be formed to have the same or substantially the same size as the silver nano-dots 13b and 13d.

The metal patterns 13 corresponding to each of the sub-pixel regions may be formed in a triangular shape, a rectangular shape, a pentagonal shape, a circular shape, a star shape, or the like according to the light to be detected. If the shapes, sizes, and materials of the metal patterns 13 in each of the sub-pixel regions are changed according to the light to be detected, the optical filtering efficiency of the metal patterns 13 may be changed.

According to example embodiments, a separate color filter that absorbs a relatively large amount of light may be omitted from a CMOS image sensor thereby increasing the amount of light reaching a p-n junction photodiode. The increase in light reaching the p-n junction photodiode may increase light detecting sensitivity of the CMOS image sensor.

While example embodiments have been particularly shown and described, it will be understood by those of ordinary skill in the art that various changes in form and details may be made therein without departing from the spirit and scope of the example embodiments as defined by the following claims.

What is claimed is:

1. An image sensing device comprising:
a p-n junction photodiode; and
a metal pattern layer on an upper surface of the p-n junction photodiode,
the metal pattern layer including a plurality of regions, each region of the metal pattern layer defining one of a plurality of sub-pixel regions, the plurality of sub-pixel regions including at least a red sub-pixel region, a green sub-pixel region, and a blue sub-pixel region contained within one pixel.

2. The image sensing device of claim 1, wherein the metal pattern layer is a strip pattern, an island shape pattern, or a metal particle layer.

3. The image sensing device of claim 1, wherein the metal pattern layer is a metal thin film layer having a contact hole pattern.

4. The image sensing device of claim 1, further comprising:
a dielectric film on the upper surface of the p-n junction photodiode, wherein the metal pattern layer is on the dielectric film.

5. The image sensing device of claim 4, wherein the dielectric film includes at least one material selected from the group consisting of $SiO_2$, SiON, $HfO_2$, and $Si_3N_4$.

6. The image sensing device of claim 4, wherein the dielectric film has a thickness of between about 3 nm and about 100 nm, inclusive.

7. The image sensing device of claim 1, wherein the metal pattern includes at least one material selected from the group consisting of Au, Ag, Cu, Al, and W.

8. The image sensing device of claim 1, wherein the metal pattern layer is comprised of nano-dots.

9. The image sensing device of claim 8, wherein the nano-dots defining the red sub-pixel region have a first size, the nano-dots defining the green sub-pixel region have a second size, and the nano-dots defining the blue sub-pixel region have a third size, the second size being smaller than the first size and the third size being smaller than the second size.

10. The image sensing device of claim 8, wherein the nano-dots defining the red sub-pixel region are spaced a first distance apart, the nano-dots defining the green sub-pixel region are spaced a second distance apart, and the nano-dots defining the blue sub-pixel region are spaced a third distance apart, the second distance being shorter than the first distance and the third distance being shorter than the second distance.

11. An image sensor, comprising:
the image sensing device of claim 1; and
a micro-lens above the metal pattern layer.

12. The image sensor of claim 11, wherein the metal pattern layer is a strip pattern, an island shape pattern, or a metal particle layer.

13. The image sensor of claim 11, wherein the metal pattern layer is a metal thin film layer having a contact hole pattern.

14. The image sensor of claim 11, wherein the image sensing device further includes,
  a dielectric film on the upper surface of the p-n junction photodiode, wherein the metal pattern layer is on the dielectric film.

15. The image sensor of claim 14, wherein the dielectric film includes at least one material selected from the group consisting of $SiO_2$, SiON, $HfO_2$, and $Si_3N_4$.

16. The image sensor of claim 14, wherein the dielectric film has a thickness of between about 3 nm and about 100 nm, inclusive.

17. The image sensor of claim 11, wherein the metal pattern layer includes at least one selected from the group consisting of Au, Ag, Cu, Al, and W.

18. The image sensor of claim 11, wherein the metal pattern layer is comprised of nano-dots.

19. The image sensor of claim 18, wherein the nano-dots defining the red sub-pixel region have a first size, the nano-dots defining the green sub-pixel region have a second size, and the nano-dots defining the blue sub-pixel region have a third size, the second size being smaller than the first size and the third size being smaller than the second size.

20. The image sensor of claim 18, wherein the nano-dots defining the red sub-pixel region are spaced a first distance apart, the nano-dots defining the green sub-pixel region are spaced a second distance apart, and the nano-dots defining the blue sub-pixel region are spaced a third distance apart, the second distance being shorter than the first distance and the third distance being shorter than the second distance.

21. The image sensor of claim 18, wherein the nano-dots have a shape selected from the group consisting of a triangular shape, a rectangular shape, a pentagonal shape, a circular shape, and a star shape.

22. An image sensing device comprising:
  a p-n junction photodiode;
  a dielectric layer on the p-n junction photodiode; and
  a color filter in the form of a metal pattern layer, the metal pattern layer being directly on the dielectric layer, the metal pattern layer configured to filter light having a first wavelength, the metal pattern layer including a plurality of regions, each region of the metal pattern layer defining one of a plurality of sub-pixel regions, the plurality of sub-pixel regions including at least a red sub-pixel region, a green sub-pixel region, and a blue sub-pixel region contained within one pixel.

23. An image sensor comprising:
  the image sensing device of claim 22; and
  a micro-lens above the image sensing device.

* * * * *